(12) United States Patent
Gurumani et al.

(10) Patent No.: US 11,979,131 B2
(45) Date of Patent: May 7, 2024

(54) HIGH-RATE DECIMATION FILTER WITH LOW HARDWARE COMPLEXITY

(71) Applicant: Hughes Network Systems, LLC, Germantown, MD (US)

(72) Inventors: Santharam Gurumani, Frederick, MD (US); James Patrick Lykins, Darnestown, MD (US); Bala Subramaniam, Potomac, MD (US)

(73) Assignee: Hughes Network Systems, LLC., Germantown, MD (US)

( * ) Notice: Subject to any disclaimer, the term of this patent is extended or adjusted under 35 U.S.C. 154(b) by 276 days.

(21) Appl. No.: 17/510,607

(22) Filed: Oct. 26, 2021

(65) Prior Publication Data

US 2022/0376680 A1   Nov. 24, 2022

Related U.S. Application Data

(60) Provisional application No. 63/190,721, filed on May 19, 2021.

(51) Int. Cl.
| | |
|---|---|
| *H03H 17/02* | (2006.01) |
| *H04B 1/16* | (2006.01) |
| *H04B 7/185* | (2006.01) |
| *H04L 12/66* | (2006.01) |
| *H03H 17/00* | (2006.01) |

(52) U.S. Cl.
CPC ........... *H03H 17/0227* (2013.01); *H04B 1/16* (2013.01); *H04B 7/185* (2013.01); *H04L 12/66* (2013.01); *H03H 2017/0081* (2013.01)

(58) Field of Classification Search
CPC ....... H03H 17/0227; H03H 2017/0081; H04B 1/16; H04B 7/185; H04L 12/66
See application file for complete search history.

(56) References Cited

U.S. PATENT DOCUMENTS

| | | | |
|---|---|---|---|
| 4,802,111 A | 1/1989 | Barkan et al. | |
| 5,500,811 A * | 3/1996 | Corry | H03H 17/06 708/319 |
| 6,208,279 B1 * | 3/2001 | Oprescu | H03M 3/374 341/143 |
| 2002/0161813 A1 * | 10/2002 | Chiueh | G06F 7/4806 708/622 |
| 2008/0114821 A1 | 5/2008 | Masumoto | |
| 2008/0126758 A1 * | 5/2008 | Kwon | G06F 9/3001 712/E9.017 |

(Continued)

OTHER PUBLICATIONS

International Search Report and Written Opinion dated Aug. 22, 2022 in corresponding PCT/US2022/027286.

*Primary Examiner* — Junpeng Chen
(74) *Attorney, Agent, or Firm* — NovoTechIP International PLLC

(57) ABSTRACT

A Finite Impulse Response (FIR) filter that reduces the complexity of the hardware required for a filter with a high decimation factor while achieving similar performance of prior art poly-phase filters of greater complexity. The FIR filter includes a small number of multiply-and-accumulate (MAC) units connected in parallel to each other between an input stream and an output stream. The MAC units are provided with coefficients from a memory. In an example implementation, the memory is addressed by a counter and the output of the memory selected by a multiplexer for suppling the coefficients.

18 Claims, 4 Drawing Sheets

(56) References Cited

U.S. PATENT DOCUMENTS

| | | |
|---|---|---|
| 2013/0110898 A1 | 5/2013 | Bal et al. |
| 2013/0322511 A1* | 12/2013 | Varma ................. H04L 27/2689 |
| | | 375/230 |
| 2016/0182014 A1 | 6/2016 | Bhargava et al. |
| 2017/0063575 A1 | 3/2017 | Balakrishnan et al. |

* cited by examiner

HIGH-RATE DECIMATION FILTER WITH LOW HARDWARE COMPLEXITY

BACKGROUND

Many communication systems use multiple data rates to transmit data. Receivers in such systems must be able to receive the multiple data rates. The receiver receives an analog communication signal and transforms it to a digital signal with an analog-to-digital conversion device commonly called an Analog-to-Digital Converter (ADC). Typical receivers supporting multiple symbol rates of operation must implement decimation filters to change sampling rate of samples received by the ADC. Depending on the symbol rate the samples are to be filtered and decimated by a decimation factor.

One approach to handle the high decimation factor filtering is to use cascaded-integrator-comb (CIC) filters. CIC filters do not require MAC units but work with high resolution accumulators for integration and further decimation. While this implementation has the least hardware complexity the filter performance in rejection of out-of-band signals is not easily controlled.

Another common approach to handle high decimation of a receiver is to use a poly-phase filter which provides the ability to design high rejection of out-of-band signals. A conventional implementation of a poly-phase filter uses a large set of samples saved in a delay-line of registers and use a low rate clock to multiply-and-accumulate (MAC) the values for each coefficient of the FIR filter designed. Further such an implementation uses multiple MAC units to parallelize the operations.

SUMMARY

While prior art poly-phase filters are a common solution which provide the ability to design filters with high rejection of out-of-band signals; however, as described in the background and further below, the poly phase filer requires large pipeline delay registers. A conventional implementation of a poly-phase filter uses a large set of samples saved in a delay-line of registers and use a low-rate clock to multiply-and-accumulate the values for each coefficient of the Finite Impulse Response ("FIR") filter. In addition, poly phase filters require a MAC unit for each coefficient of the FIR filter to parallelize the operations of the filter. Hence, there is a need for a filter with less hardware complexity and without use of large pipeline delay registers. The present disclosure addresses the aforementioned problems by describing a method and apparatus for a high-rate decimation filter with low hardware complexity.

The disclosure and claims herein are directed to an improved Finite Impulse Response (FIR) filter that reduces the complexity of the hardware required for a filter with a high decimation factor while achieving similar performance of prior art poly-phase filters of greater complexity. The FIR filter described herein includes a small number of multiply-and-accumulate (MAC) units connected in parallel to each other between an input stream and an output stream. The MAC units are provided with coefficients from a memory. In an example implementation, the memory is addressed by a counter and the output of the memory selected by a multiplexer for suppling the coefficients.

In one embodiment, there is provided a FIR filter including a plurality of MAC units connected in parallel to each other and between an input stream and an output stream, where each of the plurality of MAC unit includes a multiplier connected in series with an adder and an accumulator; a memory with coefficients for the MAC units; and a first multiplexer connected to the plurality of the MAC units and configured to receive an output of the MAC units and provide one output of one of the MAC units to the output stream, wherein: the multiplier is configured to receive an input sample and coefficients from the memory and multiply the input sample with the coefficients to produce a multiplier output to the adder, the adder is configured to add the multiplier output from the multiplier with a last value stored in a register of the accumulator to produce an accumulator output to the first multiplexer, the plurality of MAC units are configured to operate in parallel with each other and an output is generated for the output stream periodically using one of the MAC units based on a decimation factor.

In another embodiment, there is provided a FIR filter comprising, a plurality of MAC units connected in parallel to each other between an input stream and an output stream, where each of the plurality of MAC unit includes a multiplier connected in series with an adder and an accumulator; a memory with N rows of coefficients for the MAC units with each row of the N rows including a number of coefficients for each of the MAC units, where N is an integer equal to the decimation factor; and a first multiplexer connected to the plurality of the MAC units and configured to receive an output of the MAC units and provide an output of one of the MAC units to the output stream, wherein: the multiplier is configured to receive an input sample and coefficients from the memory and multiply the input sample with the coefficients to produce a multiplier output to the adder, wherein the first multiplexer selects one accumulator periodically based on the decimation factor to provide the output of the selected one accumulator to the output stream, and the one selected accumulator resets its register, the adder is configured to add the multiplier output from the multiplier with a last value stored in a register of the accumulator to produce an accumulator output to the first multiplexer, and the plurality of MAC units are configured to operate in parallel with each other and the output of one of the MAC units is generated for the output stream periodically based on a decimation factor.

In another embodiment, there is provided a FIR filter comprising, a plurality of MAC units connected in parallel to each other between an input stream and an output stream, where each of the plurality of MAC unit includes a multiplier connected in series with an adder and an accumulator; a memory with N rows of coefficients for the MAC units with each row of the N rows including a number of coefficients for each of the MAC units, where N is an integer equal to the decimation factor; a coefficient generation circuit that controls the generation of coefficients from the memory comprising a counter and a second multiplexer, wherein: the counter has C total bits equal to L least significant bits plus M most significant bits, where C, L and M are integers, the L least significant bits are applied to address the memory and the M most significant bits are applied to the second multiplexer to select a set of coefficients stored at a current address of the memory indicated by the L least significant bits to apply to the set of coefficients to the MAC units; and a first multiplexer connected to the plurality of the MAC units and configured to receive an output of the MAC units and provide an output of one of the MAC units to the output stream, wherein: wherein the first multiplexer selects one accumulator periodically based on the decimation factor to provide the output of the selected one accumulator to the output stream, and the one selected accumulator resets its register, the multiplier is configured to receive an input sample and coefficients from the memory and multiply the input sample with the coefficients to produce a multiplier output to the adder, the adder is configured to add the multiplier output from the multiplier with a last value stored in a register of the accumulator to produce an accumulator output to the first multiplexer, the plurality of MAC units are configured to operate in parallel with each other and the output of one of the MAC units is generated for the output stream periodically based on a decimation factor; and the plurality of MAC units includes 4 MAC units and the decimation factor is 64.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

DETAILED DESCRIPTION

In the following detailed description, numerous specific details are set forth by way of examples to provide a thorough understanding of the disclosed subject matter. It may become apparent to persons of ordinary skill in the art, though, upon reading this disclosure, that one or more disclosed aspects may be practiced without such details. In addition, description of various example implementations according to this disclosure may include referencing of or to one or more known techniques or operations, and such referencing can be at relatively high-level, to avoid obscuring of various concepts, aspects and features thereof with details not particular to and not necessary for fully understanding the present disclosure.

Typical receivers supporting multiple symbol rates of operation must implement decimation filters to change sampling rate of samples received from an Analog-to-Digital Conversion (ADC) device. In an example implementation described herein, 59.904 MHz rate ADC samples are decimated by a factor of 64 to get 936 KHz samples. This Finite Impulse Response ("FIR") filter described herein uses only 4 multiply-and-accumulate ("MAC") units for each filter to achieve this function without use of large pipeline delay registers used in typical filter implementation. Where two filters are needed for in-phase and quadrature-phase samples, both filters can use the same coefficient memory to retrieve coefficients and work in tandem. While the described filter reduces the complexity of the hardware required for a filter with a high decimation factor, it achieves similar performance of prior art poly-phase filters.

Figure 1:
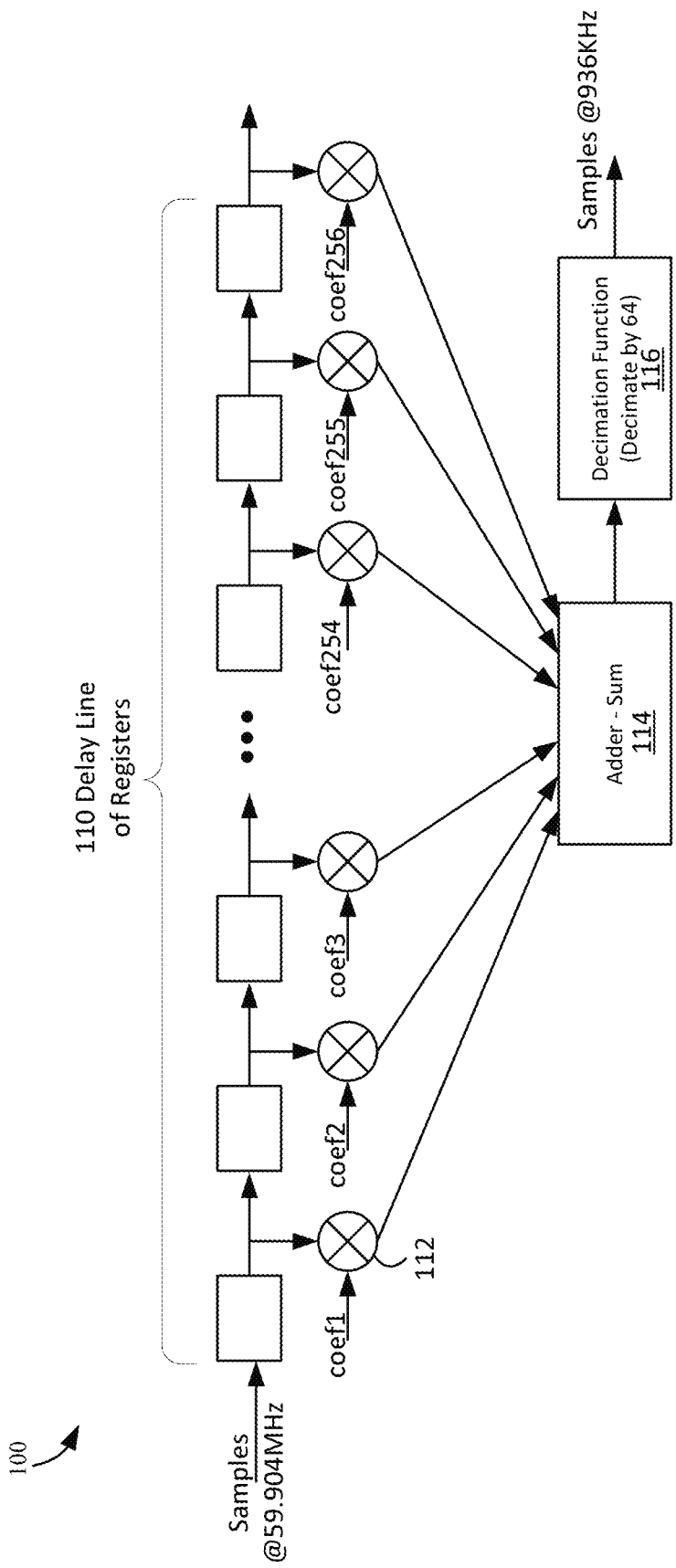
FIG. 1 illustrates a prior art implementation of a poly phase Finite Impulse Response ("FIR") filter.

FIG. 1 illustrates an implementation of a poly-phase FIR filter 100 according to the prior art. The FIR filter 100 includes a long delay line 110 and a set of coefficients chosen to meet certain in-band and out-of-band filter characteristics. This implementation involves the storage of all values in the registers of the delay line 110 and a number of multiplier units 112 to perform the vector multiplication followed by an adder 114. The output of the adder is then decimated by 64 by decimation function 116 and the samples output at the reduced rate of 932 kHz. Not all the outputs of the FIR filter are required for a decimation filter where samples are dropped based on decimation factor; hence most of the computations may not be used. For example, the FIR filter of order 256 will involve a vector multiplication of a delay line of 256 samples multiplied by the 256 coefficients of the filter. In a decimation filter, however, all the outputs are not used; hence in the case of a decimation by 64 polyphase filter only one out of every such 64 computation of the 256-taps filter is saved and sent to the next stage. Poly-phase FIR filters such as shown in FIG. 1 are commonly used in the prior art. A typical implementation uses number of registers to store the pipelined delay samples and use MAC units to compute all the samples in the delay line. However, this prior art implementation requires a significant amount of complex hardware for high decimation filters.

Figure 2:
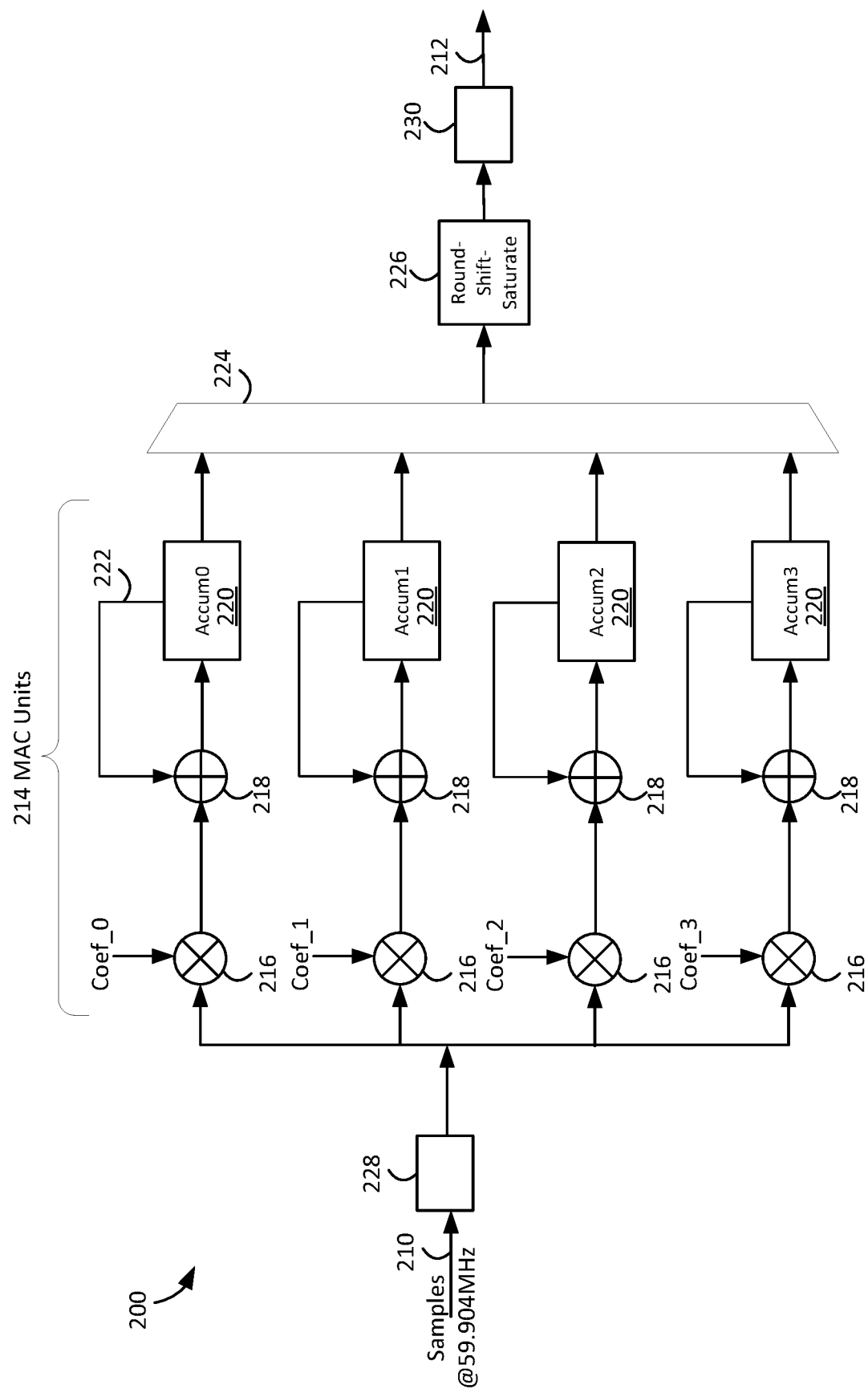
FIG. 2 illustrates an example implementation an improved FIR filter that reduces the complexity of the hardware required for a filter with a 64 decimation factor using 4 multiply-and-accumulate ("MAC") units connected in parallel to each other.

FIG. 2 illustrates an example of an improved FIR filter 200 with reduced hardware complexity. This improved FIR filter 200 provides a multi sample rate filter with high decimation without the need for an extensive number of registers used in prior art filters such as the FIR filter shown in FIG. 1. The FIR filter 200 includes 4 MAC units 214 connected in parallel with each other between an input stream 210 and output stream 212. Each MAC unit 214 includes a multiplier 216 connected in series with an adder 218 and accumulator 220. The accumulator 220 is typically a register. The multiplier 216 multiplies an input sample with the relevant coefficient provided to each MAC unit from the circuit shown in FIG. 3. The result from the multiplier 216 is then added to the last stored value (represented by the arrow 222) of the accumulator register 220, and the result is stored in the accumulator register 220. An output is generated by selecting one of the accumulator outputs with the multiplexer 224 where one accumulator 220 is selected by the multiplexer 224 every 64 clock cycles as described below. The FIR filter 200 may include configurable rounding, shifting and saturating function block 226 which is then supplied the $Z^{-1}$ block at 230.

Referring again to FIG. 2, the configurable rounding, shifting and saturation block 226 reduces the number of bits in the accumulator 220 to a required number of bits as per the modulation and dynamic range requirements of the signal. For example, a 40-bit accumulator in 220 could be reduced 12-bits after the operation of block 226. The $Z^{-1}$ block 230 is a hardware register to save the final output after rounding, shifting and saturation in block 226 at the output clock rate of 936 kHz. This output is available on the next 936 kHz processing clock for other blocks that follow (not shown). Similarly, the $Z^{-1}$ block 228 is a hardware register to save the input sample received at the input 210 with a clock rate of 59.904 MHz. This data is available on the next processing clock for the multiplication in multiplier 216. These registers 228, 230 are often used in a design to meet the timing constraints in the hardware synthesis.

In the illustrated example, the wideband input sample rate is 59.904 MHz applied at input 210. The final decimated output at 212 is at a 936 KHz sample rate. Therefore, the decimation factor is 64 (e.g., 59904/936). Once every 64 clocks (based on decimation factor), the output is generated using one of the accumulators by scaling and saturating the value. The accumulator that provided the output will then be reset before next set of values are accumulated. Specifically, every time a new sample comes at the sample rate of 59.904 MHz, each MAC unit in parallel receives a coefficient and multiplies it with a relevant portion of the input stream as shown and described further with respect to FIG. 3. The multiplied result is then added to last stored value of the accumulator register and then the added result is stored in the accumulator register. The FIR filter 200 described does not store all the samples of the delay line required in filter computations like was done in the prior art example shown in FIG. 1.

A 256 taps equivalent FIR filter show in FIG. 2 is implemented with just 4 MAC units to decimate by a factor of 64. However, in other examples, the number of MAC units may vary depending on the sample size and the decimation factor. In this specific example, the sample size is 256 and the decimation factor is 64. Therefore, the number of MAC units is equal to 4 (e.g., 256/64=4). In another specific example, where the filter order of 512 is needed, the number of MAC units would be 8 for the decimation factor of 64 (e.g., 512/64=8).

A 256 taps equivalent FIR filter may be used to achieve a rejection of more than 75 dB on an out-of-band signal. The 4 MAC units are chosen to correspond to the 4 outputs generated for each 256 samples (256/64=4). The 4 MAC units will stagger the computation in such a way that every 64 samples one of the MAC units will output a sample and reset its own accumulator. Therefore, unlike the FIR filter shown in FIG. 1, the FIR filter of FIG. 2 does not have to store the 256 samples because the computations are performed as the new sample comes in. These four MAC units take the new sample whenever a new sample comes, it multiplies with the coefficient and adds the result to respective the accumulator. The MAC units 214 continue to operate in this way for 256 samples. Significantly, the computations are staggered by 64 samples, and each MAC unit 214 uses different coefficients 322 (FIG. 3) out of the 256 coefficients from the RAM 314. With such staggered computation of the four MAC units, every 64 clocks of the input, one output is selected from the Mux 224 (FIG. 2).

Figure 3:
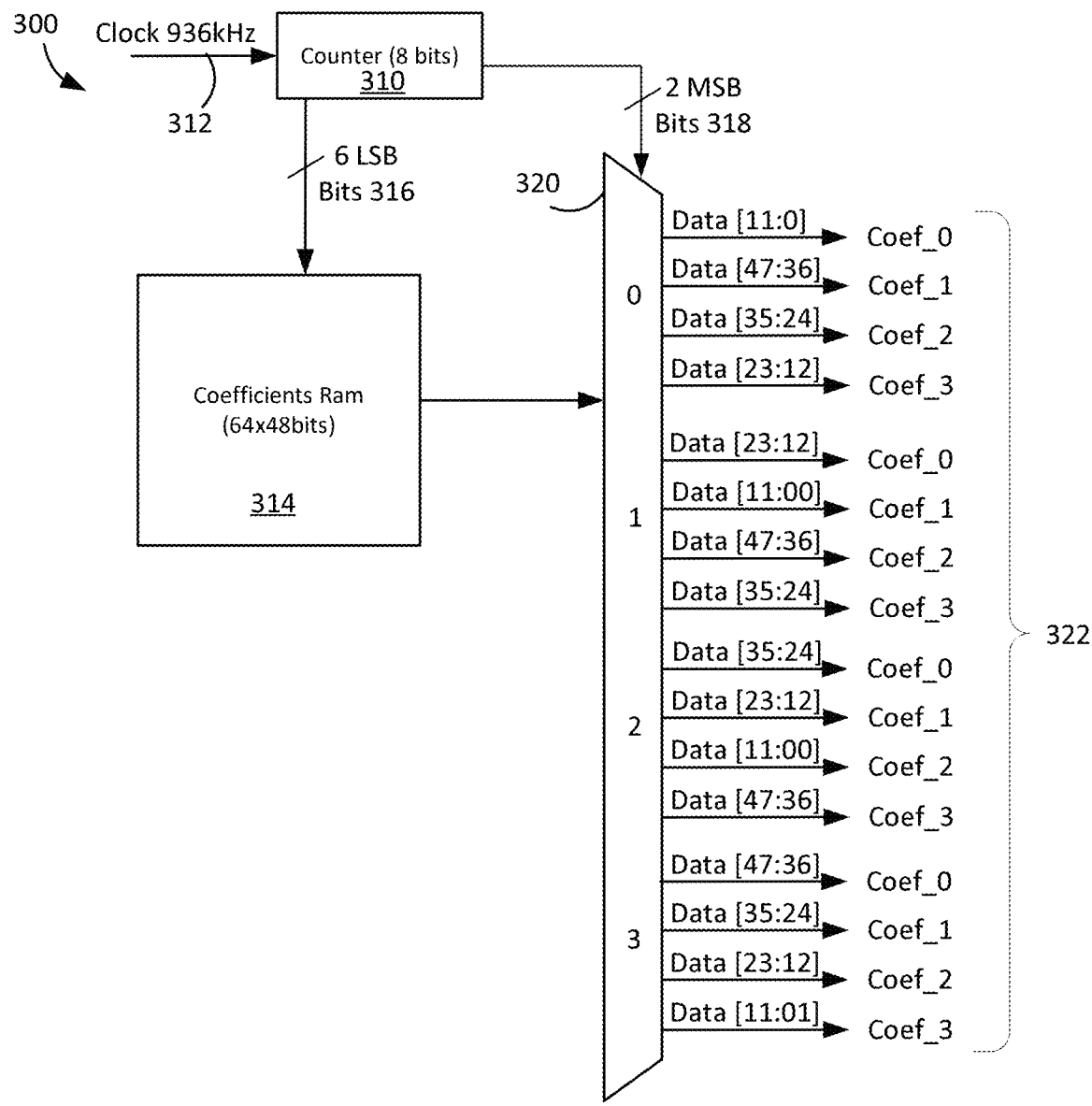
FIG. 3 illustrates an example circuit for generation of coefficients for each MAC unit of the FIR filter of FIG. 2.

In an illustrated implementation, coefficients are supplied to the MAC units 214 from a coefficient memory 314 as shown in FIG. 3. In the illustrated example for 64 decimation factor, the coefficient memory 314 is organized in 4 columns configured to retrieve 4 coefficient values (4 sets of coefficients) each clock, where each MAC unit uses a different set of coefficients to multiply and accumulate. The same set of coefficients are used by the MAC units of "in-phase" and "quadrate-phase" sample filters. The described FIR filter uses minimal hardware (without any pipelined storage of samples in register) and can be operated by a simple finite-state-machine (not shown) to retrieve coefficients for the operation and generate output samples (with scaling and saturation).

FIG. 3 illustrates a coefficient generation circuit 300 for generation of coefficients used by the MAC units 214 in FIG. 2 on each clock (or input sample). A counter in the coefficient generation circuit 300 is clocked at the input 312 with an input sample rate. The counter 310 is used to count the sample currently used, fetch from memory the correct row of coefficients to select correct output samples for each MAC unit as described above. The lower significant bits (LSB) of the counter are used to access the memory 314 and the upper or most significant bits (MSB) are used to select the coefficients from the row of memory. In the example described herein, the FIR filter has an output sample rate of 936 kHZ, and the counter 310 is an 8-bit counter clocked by a 936 kHZ clock at the input 312. The 6 LSB bits 316 of the counter 310 are applied to a memory referenced as coefficients ram 314. The 2 upper or MSB significant bits 318 are applied to the data selector or multiplexer 320. The coefficients RAM 314 is organized into a 64×48 bit array described further below. In this example, each coefficient is a 12-bit value. The selector 320 inputs the 48 bits from the coefficient RAM 314 for the current value of the counter 310. The 48 bits are applied to the coefficients (Coef_0, Coef_1, Coef2, Coef3) depending on the 2 MSB bits as shown and described herein.

Figure 4:
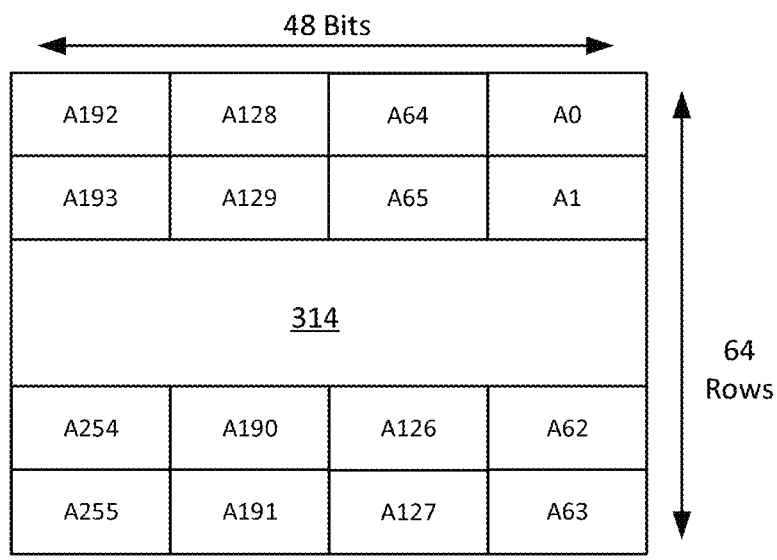
FIG. 4 illustrates an example of organization of coefficients in the RAM memory of the FIR filter of FIG. 2.

FIG. 4 illustrates the coefficient organization in the RAM 314. RAM 314 provides a correct set of coefficients for each MAC unit on each clock (or input sample) as described above. For the described example circuit, coefficients RAM 314 includes 64 rows (addressed by 6 LSB bits) with 48 bits of data for each row. For each 6 bit address (64 rows), 48 bits of data corresponding to each row are output from the memory to the 4 MAC units as shown in FIG. 3. The memory of RAM 314 can be logically represented as shown with 64 rows (A0 through A63) with 48 bits. The 48 bits are divided into four addresses as shown and selected by the 2 MSBs of the counter as described above. Thus, there are 256 addresses (A0-A255) of the RAM 314 containing a set of 12 coefficients. In this example, the RAM 314 organization can also be viewed as the coefficients for Coef_0 using the addresses A0-A63. The other coefficients Coef_1 through Coef_3 will get a set of coefficients from the same row in the RAM 314 as Coef_0. The coefficients thus get the same data from RAM 314 but in a different order. The order of the data for the coefficients is reflected in the outputs from Mux 320 as shown and described in the following paragraph.

As introduced above, each MAC unit 214 will receive a different portion of the 48 bits data (e.g., coefficient values) from the RAM 314 based on the 2 MSBs of the counter 310. To illustrate, when the 2 MSBs from the counter 310 is 00, the Coef_0 of the FIR filter would correspond to data bits 11:00 located in cell A0 of the memory as shown in FIG. 3. At the same time, coefficient 1 (coef_1) of the FIR filter would correspond to data 47:36 of the first row (also cell A192); coef_2 would correspond to data 35:24 of the first row (cell A128); and coef_3 would correspond to data bits 23:12 of the first row (cell A64). Once the upper 2-bits of the counter is incremented to 1, the 48 bits data from the second row are fed to the MAC units. However, when cycling through the columns of the memory for each row the order of the bits supplied to the coefficients is different. For example, in the second row, the data bits 23:12 would correspond to the coef_0; the data bits 11:0 would correspond to coef_1; and the data bits 47:36 would correspond to Coef_2 and the data bits 23:12 would correspond to Coef_3. As such, in this implementation, all MAC units are working together at the same time but use different columns or different entries of the coefficients RAM 314.

An FIR filter with a high decimation factor can be advantageous in a mobile satellite receiver to support multiple symbol rates on satellite terminal products. The described FIR filter could also be used in other communication products (for example, satellite or cellular systems), where multiple user symbol rates are to be configured. The described FIR filter can reduce the hardware resources needed in ASIC and/or FPGA implementation for these systems.

Figure 5:
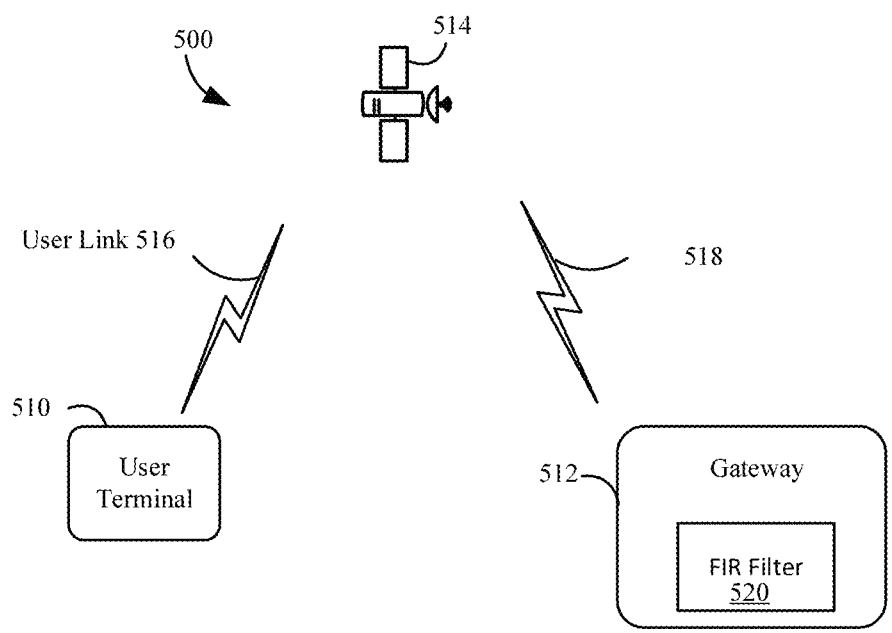
FIG. 5 illustrates an example satellite system that utilizes a FIR filter for multi data rate communication.

FIG. 5 illustrates a satellite communication system 500 that may incorporate the FIR filter described herein. The satellite system 500 includes a user terminal 510 that communicates with a gateway 512 over a satellite 514. The user terminal 510 communicates with the satellite 514 over a user link 516. The satellite 514 communicates with the gateway 512 over a gateway link 518. These links may be in and appropriate band, for example in the Ka or Ku band as known in the art. The gateway 512 includes a receiver (not shown) that can receive multiple data rates using the FIR filter 520 as described herein to receive multi rate data with a high decimation rate. The user terminal and the satellite may also include a FIR filter 520 (not shown) for communicating with multi data rates as described herein.

While this implementation is optimized for a specific sample rate decimation, this approach could be generalized for a configurable decimation factor and filter size. For example, if a filter with 512 taps is needed, then 8 MAC units could be used per filter with corresponding organization of the memory with 128 rows of 96 bits, where there are 11 bits in the counter divided into 8 least significant bits and 3 most significant bits. More optimization of the filter coefficient memory organization could be achieved to exploit the symmetry of the coefficients than prior art filters.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein.

Unless otherwise stated, all measurements, values, ratings, positions, magnitudes, sizes, and other specifications that are set forth in this specification are approximate, not exact. They are intended to have a reasonable range that is consistent with the functions to which they relate and with what is customary in the art to which they pertain.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The invention claimed is:

1. A finite impulse response (FIR) filter comprising:
a plurality of multiply-and-accumulate (MAC) units connected in parallel to each other between an input stream and an output stream, wherein each of the plurality of MAC unit includes a multiplier connected in series with an adder and an accumulator;
a memory with coefficients for the MAC units;
a first multiplexer connected to the plurality of the MAC units and configured to receive an output of the MAC units and provide an output of one of the MAC units to the output stream;
a coefficient generation circuit that controls the generation of coefficients from the memory comprising a counter and a second multiplexer, wherein:
the counter has C total bits equal to L least significant bits plus M most significant bits, where C, L and M are integers,
the L least significant bits are applied to address the memory and the M most significant bits are applied to the second multiplexer to select a set of coefficients stored at a current address of the memory indicated by the L least significant bits to apply the set of coefficients to the MAC units,
the multiplier is configured to receive an input sample and coefficients from the memory and multiply the input sample with the coefficients to produce a multiplier output to the adder,
the adder is configured to add the multiplier output from the multiplier with a last value stored in a register of the accumulator to produce an accumulator output to the first multiplexer, and
the plurality of MAC units are configured to operate in parallel with each other and the output of one of the MAC units is generated for the output stream periodically based on a decimation factor.

2. The FIR filter of claim 1, wherein the first multiplexer selects one accumulator periodically based on the decimation factor to provide the output of the selected one accumulator to the output stream, and the one selected accumulator resets its register.

3. The FIR filter of claim 1, wherein the memory includes N of rows of coefficients where N is equal to the decimation factor, and where each row of the N rows includes a number of coefficients for each of the MAC units.

4. The FIR filter of claim 1, wherein the M most significant bits select coefficients for each of the MAC units from a row of the memory in a different order for each MAC unit depending on a current value of the M most significant bits.

5. The FIR filter of claim 1, wherein the plurality of MAC units includes 4 MAC units and the decimation factor is 64.

6. The FIR filter of claim 5, wherein the multiplexer selects one of accumulator outputs every 64 clocks based on the decimation factor being 64 to provide the output to the output stream, and the one selected accumulator resets its register.

7. The FIR filter of claim 6, wherein each of the four MAC units receive 12 different coefficients from the memory.

8. The FIR filter of claim 1, wherein the filter is part of a receiver in a gateway of a satellite communication system.

9. The FIR filter of claim 1, wherein the input stream has a sampling rate of 59.904 MHz, the output stream has a sampling rate of 936 kHz.

10. A finite impulse response (FIR) filter comprising:
a plurality of multiply-and-accumulate (MAC) units connected in parallel to each other between an input stream and an output stream, wherein each of the plurality of MAC unit includes a multiplier connected in series with an adder and an accumulator;
a memory with N rows of coefficients for the MAC units with each row of the N rows including a number of coefficients for each of the MAC units, wherein N is an integer equal to a decimation factor;
a first multiplexer connected to the plurality of the MAC units and configured to receive an output of the MAC units and provide an output of one of the MAC units to the output stream;
a coefficient generation circuit that controls the generation of coefficients from the memory comprising a counter and a second multiplexer, wherein:
the counter has C total bits equal to L least significant bits plus M most significant bits, where C, L and M are integers, and
the L least significant bits are applied to address the memory and the M most significant bits are applied to the second multiplexer to select a set of coefficients stored at a current address of the memory indicated by the L least significant bits to apply the set of coefficients to the MAC units;
the multiplier is configured to receive an input sample and coefficients from the memory and multiply the input sample with the coefficients to produce a multiplier output to the adder,
the first multiplexer selects one accumulator periodically based on the decimation factor to provide the output of the selected one accumulator to the output stream, and the one selected accumulator resets its register,
the adder is configured to add the multiplier output from the multiplier with a last value stored in a register of the accumulator to produce an accumulator output to the first multiplexer, and
the plurality of MAC units are configured to operate in parallel with each other and the output of one of the MAC units is generated for the output stream periodically based on a decimation factor.

11. The FIR filter of claim 10, wherein the M most significant bits select coefficients for each of the MAC units from a row of the memory in a different order for each MAC unit depending on a current value of the M most significant bits.

12. The FIR filter of claim 10, wherein the plurality of MAC units includes 4 MAC units and the decimation factor is 64.

13. The FIR filter of claim 12, wherein the multiplexer selects one of accumulator outputs every 64 clocks based on the decimation factor being 64 to provide the output to the output stream, and the one selected accumulator resets its register.

14. The FIR filter of claim 12, wherein:
the input stream has a sampling rate of 59.904 MHz, and
the output stream has a sampling rate of 936 kHz.

15. A finite impulse response (FIR) filter comprising:
a plurality of multiply-and-accumulate (MAC) units connected in parallel to each other between an input stream and an output stream, wherein each of the plurality of MAC unit includes a multiplier connected in series with an adder and an accumulator;
a memory with N rows of coefficients for the MAC units with each row of the N rows including a number of coefficients for each of the MAC units, where N is an integer equal to a decimation factor;
a coefficient generation circuit that controls the generation of coefficients from the memory comprising a counter and a second multiplexer, wherein:
the counter has C total bits equal to L least significant bits plus M most significant bits, where C, L and M are integers, and
the L least significant bits are applied to address the memory and the M most significant bits are applied to the second multiplexer to select a set of coefficients stored at a current address of the memory indicated by the L least significant bits to apply the set of coefficients to the MAC units; and
a first multiplexer connected to the plurality of the MAC units and configured to receive an output of the MAC units and provide an output of one of the MAC units to the output stream, wherein:
the first multiplexer selects one accumulator periodically based on the decimation factor to provide the output of the selected one accumulator to the output stream, and the one selected accumulator resets its register,
the multiplier is configured to receive an input sample and coefficients from the memory and multiply the input sample with the coefficients to produce a multiplier output to the adder,
the adder is configured to add the multiplier output from the multiplier with a last value stored in a register of the accumulator to produce an accumulator output to the first multiplexer,
the plurality of MAC units are configured to operate in parallel with each other and the output of one of the MAC units is generated for the output stream periodically based on a decimation factor,
the plurality of MAC units includes 4 MAC units and the decimation factor is 64, and
the filter is part of a receiver in a gateway of a satellite communication system.

16. The FIR filter of claim 15, wherein the M most significant bits select coefficients for each of the MAC units from a row of the memory in a different order for each MAC unit depending on a current value of the M most significant bits.

17. The FIR filter of claim 16, wherein the multiplexer selects one of accumulator outputs every 64 clocks based on the decimation factor being 64 to provide the output to the output stream, and the one selected accumulator resets its register.

18. The FIR filter of claim 17, wherein each of the four MAC units receive 12 different coefficients from the memory, the input stream has a sampling rate of 59.904 MHz, and the output stream has a sampling rate of 936 kHz.

* * * * *